United States Patent [19]
Uomoto

[11] Patent Number: 5,507,022
[45] Date of Patent: Apr. 9, 1996

[54] ELECTRIC FIELD LEVEL DETECTING APPARATUS

[75] Inventor: Yasutomo Uomoto, Tokyo, Japan

[73] Assignee: NEC Corporation, Japan

[21] Appl. No.: 297,225

[22] Filed: Aug. 29, 1994

[30] Foreign Application Priority Data

Aug. 30, 1993 [JP] Japan .................................. 5-235912

[51] Int. Cl.$^6$ .............................. H04B 1/16; H04B 17/00
[52] U.S. Cl. .................................. 455/226.2; 455/226.4; 455/249.1; 455/308
[58] Field of Search ................................ 455/67.1, 67.7, 455/226.1–226.4, 134, 135, 277.2, 249.1, 308

[56] References Cited

U.S. PATENT DOCUMENTS

| 5,163,163 | 11/1992 | Sato | 455/226.1 X |
| 5,351,271 | 9/1994 | Coquerel | 455/226.1 X |
| 5,390,365 | 2/1995 | Enoki et al. | 455/226.2 X |

FOREIGN PATENT DOCUMENTS

| 61-166207 | 7/1986 | Japan . |
| 64-13826 | 1/1989 | Japan . |
| 2-186723 | 7/1990 | Japan . |
| 4-302542 | 10/1992 | Japan . |

Primary Examiner—Reinhard J. Eisenzopf
Assistant Examiner—Chi H. Pham
Attorney, Agent, or Firm—Ostrolenk, Faber, Gerb & Soffen

[57] ABSTRACT

An electric field level detecting apparatus includes an intermediate-frequency signal generator, an intermediate-frequency amplifier, an analog voltage generator, an analog/digital converter, N converting tables, and a control circuit. The variable attenuator receives an intermediate-frequency signal from the intermediate-frequency signal generator as an input and changes a passing attenuation value in accordance with an attenuation value set to be changed at N steps (N: arbitrary natural number) by a first control signal. Each of the N converting tables prestores a relationship between a digital voltage and an electric field strength of a radio frequency reception signal corresponding to the attenuation value set in the variable attenuator and converts the digital voltage from the analog/digital converter into an electric field level signal indicating a corresponding electric field strength to output the electric field level signal. The control circuit outputs the first control signal for setting the attenuation value of the variable attenuator to be changed at N steps on the basis of the digital voltage from the analog/digital converter to select one of the converting tables in accordance with the attenuation value set in the variable attenuator.

13 Claims, 4 Drawing Sheets

ELECTRIC FIELD LEVEL DETECTING APPARATUS

BACKGROUND OF THE INVENTION

The present invention relates to an electric field level detecting apparatus for detecting the reception electric field level of a receiver.

In general, in a mobile radio communication system such as a mobile telephone system, the reception electric field level of a reception signal must be always monitored to hand over a mobile station from a base state in communication to an adjacent base station. In order to monitor the reception electric field level, the mobile station comprises an electric field level detecting circuit for detecting the reception level of a reception signal from at least one of the base station in communication and the adjacent base station.

A conventional electric field level detecting circuit, as shown in FIG. 5, comprises a radio frequency amplifier 22 for amplifying a radio frequency reception signal input from an antenna 21, a mixer circuit 23 for converting an output from the radio frequency amplifier 22 into a first intermediate-frequency signal a, an intermediate-frequency amplifier 24 for amplifying the first intermediate-frequency signal a to output a second intermediate-frequency signal b, a limiter amplifier circuit 25 for receiving the second intermediate-frequency signal b as an input and outputting an analog voltage c corresponding to the level of the second intermediate-frequency signal b, an analog/digital converter 26 for converting the analog voltage c into a digital voltage d, and a table 27 for receiving the digital voltage d as an input and causing a reception electric field level indicating the electric field strength of the radio frequency reception signal to correspond to the digital voltage d.

The operation of the conventional electric field level detecting circuit will be described below.

The radio frequency reception signal input from the antenna 21 is amplified by the radio frequency amplifier 22 and converted into the first intermediate-frequency signal a by the mixer circuit 23. This first intermediate-frequency signal a is amplified as the second intermediate-frequency signal b by the intermediate-frequency amplifier 24 and input to the limiter amplifier circuit 25.

The limiter amplifier circuit 25 outputs the analog voltage c corresponding to the level of the second intermediate-frequency signal b, and the analog voltage c is converted into the digital voltage d by the analog/digital converter 26. The reception electric field level is read out from the table 27 which causes the reception electric field level indicating the electric field strength of the radio frequency reception signal input from the antenna 21 to correspond to the digital voltage d, thereby detecting an electric field strength.

In this conventional electric field level detecting circuit, when a radio frequency reception signal having a high electric field strength is input, the intermediate-frequency amplifier 24 is saturated. For this reason, the relationship between the electric field strength of the radio frequency reception signal input to the antenna 21 and the second intermediate-frequency signal b output from the intermediate-frequency amplifier 24 has nonlinearity, and an electric field level cannot be correctly detected.

SUMMARY OF THE INVENTION

It is an object of the present invention to provide an electric field level detecting apparatus capable of detecting a correct reception electric field level even when the dynamic range of a receiver is short.

It is another object of the present invention to provide an electric field level detecting apparatus capable of widening a range in which a reception electric field level can be detected.

In order to achieve the above objects, according to the present invention, there is provided an electric field level detecting apparatus comprising intermediate-frequency signal generating means for amplifying a radio frequency reception signal input from an antenna to convert the radio frequency reception signal into a first intermediate-frequency signal, variable attenuating means for receiving the first intermediate-frequency signal from the intermediate-frequency signal generating means as an input and changing a passing attenuation value in accordance with an attenuation value set to be changed at N steps (N: arbitrary natural number) by a first control signal, intermediate-frequency amplifying means for amplifying an output from the variable attenuating means to output a second intermediate-frequency signal, analog voltage generating means for outputting an analog voltage corresponding to a level of the second intermediate-frequency signal from the intermediate-frequency amplifying means, analog/digital converting means for converting the analog voltage from the analog voltage generating means into a digital voltage, N converting tables, each for storing a relationship between the digital voltage and an electric field strength of the radio frequency reception signal corresponding to the attenuation value set in the variable attenuating means in advance and converting the digital voltage from the analog/digital converting means into an electric field level signal indicating a corresponding electric field strength to output the electric field level signal, and control means for outputting the first control signal for setting the attenuation value of the variable attenuating means to be changed at N steps on the basis of the digital voltage from the analog/digital converting means to select one of the converting tables in accordance with the attenuation value set in the variable attenuating means.

DESCRIPTION OF THE PREFERRED EMBODIMENT

The present invention will be described below with reference to the accompanying drawings.

Figure 1:
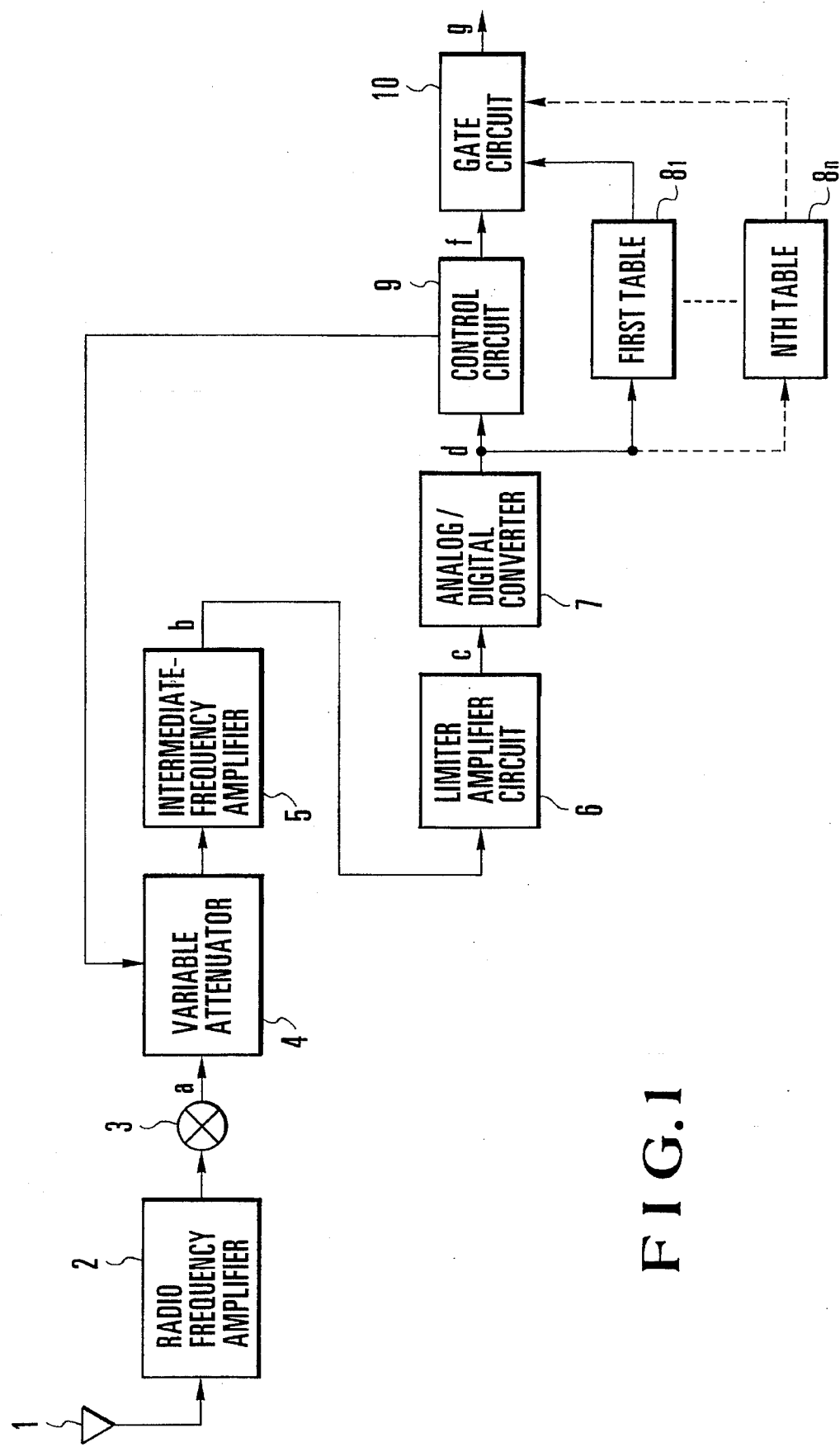
FIG. 1 is a block diagram showing an embodiment of an electric field level detecting circuit according to the present invention.

FIG. 1 shows an embodiment of an electric field detecting circuit.

Referring to FIG. 1, reference numeral 1 denotes an antenna; 2, a radio frequency amplifier for amplifying a radio frequency reception signal input from the antenna 1; 3, a mixer circuit for mixing an output from the radio frequency amplifier 2 with a local frequency signal (not shown) to convert the output into an intermediate-frequency signal a; 4, a variable attenuator 4 for receiving the intermediate-frequency signal a from the mixer circuit 3 as an input and changing a passing attenuation value in accordance with an attenuation value set to be changed at N steps by a control signal e; 5, an intermediate-frequency amplifier 5 for amplifying an output from this attenuator 4 to output an intermediate-frequency signal b; 6, a limiter amplifier circuit, which serves as an analog voltage generating means and receiving the intermediate frequency signal b as an input and outputting an analog voltage c corresponding to the level of the intermediate frequency signal b; 7, an analog/digital converter 7 for converting the analog voltage c from the limiter amplifier circuit 6 into a digital voltage d; $8_1 \ldots , 8_n$, first to nth, i.e., N tables $8_1$ to $8_n$, each for receiving the digital voltage d from the analog/digital converter 7 as an input and causing a reception electric field level indicating the electric field strength of a radio frequency signal to correspond to the digital voltage d; 9, a control circuit for receiving the digital voltage d from the analog/digital converter 7 as an input and outputting the first control signal e for setting the attenuation value of the variable attenuator 4 to be changed at N steps on the basis of the value of the digital voltage d; and 10, a gate circuit 10 for selecting one of outputs from the N tables $8_1$ to $8_n$ by a second control signal f output from the control circuit 9 to output an electric field level detection signal g. The N table $8_1$ to $8_n$ are selected in accordance with the second control signal f corresponding to the attenuation value of the variable attenuator 4 set to be changed at N steps by the first control signal e from the control circuit 9. Converting tables to reception electric field levels and based on the digital voltage d corresponding to the attenuation value of the variable attenuator 4 are set in the N tables $8_1$ to $8_n$, respectively.

Figure 2:
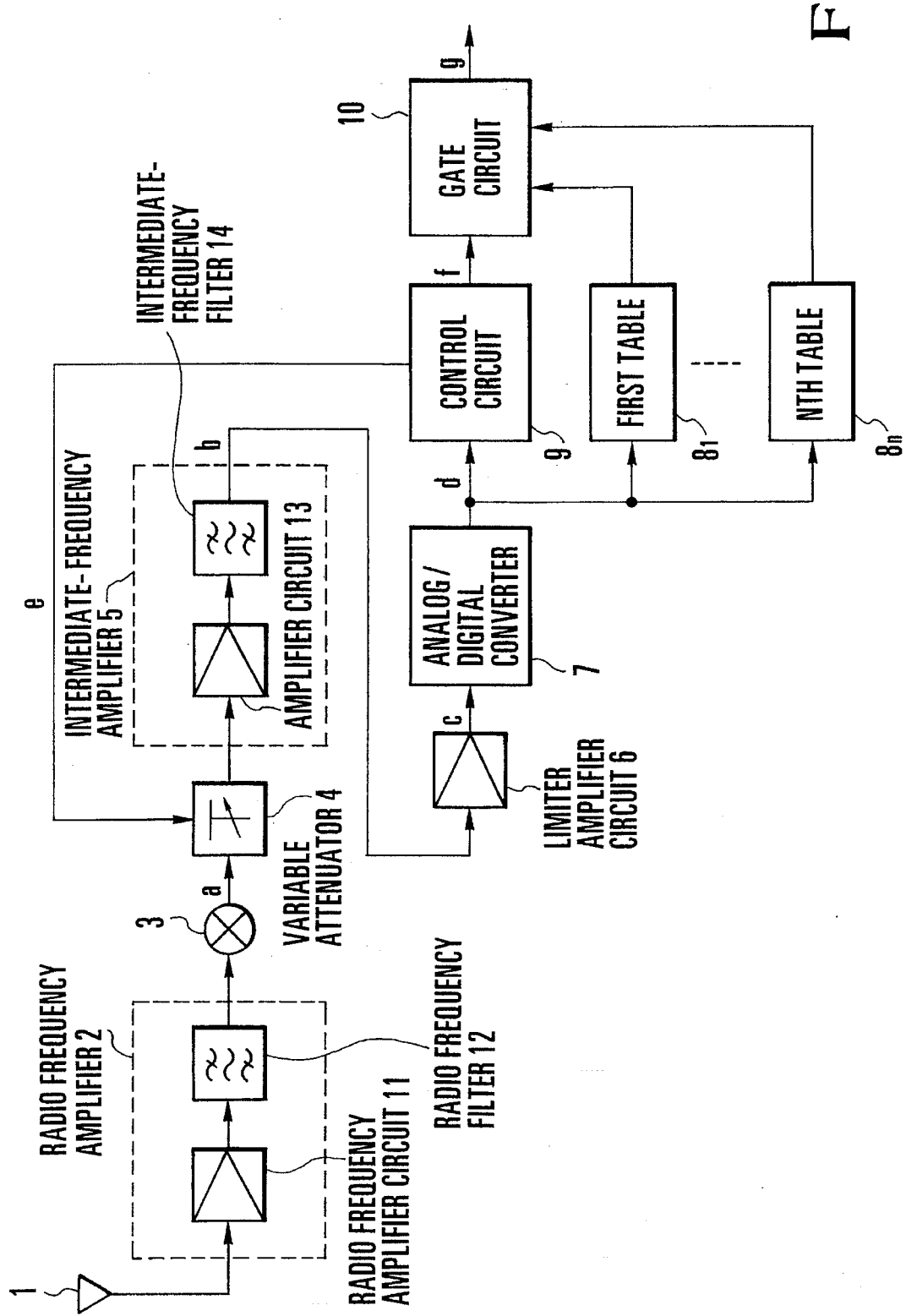
FIG. 2 is a block diagram showing an example in which the electric field level detecting circuit in FIG. 1 is applied to a receiver.

FIG. 2 shows a case wherein the electric field level detecting circuit shown in FIG. 1 is applied to a receiver.

The same reference numerals in FIG. 2 denote the same parts as in FIG. 1. Referring to FIG. 2, reference numeral 11 denotes a radio frequency amplifier circuit for amplifying a radio frequency signal input from the antenna 1; and 12, a radio frequency filter 12 for filtering the amplified signal to remove an unnecessary component out of a reception band. The radio frequency amplifier circuit 11 and the radio frequency filter 12 constitute the radio frequency amplifier 2 in FIG. 1. Reference numeral 13 denotes an amplifier circuit 13 for amplifying an output signal from the variable attenuator 4; and 14, an intermediate-frequency filter for receiving an output from the amplifier circuit 13 and filtering the output to remove an necessary component. The amplifier circuit 13 and the intermediate-frequency filter 14 constitute the intermediate-frequency amplifier 5 in FIG. 1.

The operation of the electric field level detecting circuit shown in FIG. 2 will be described below.

A radio frequency reception signal input from the antenna 1 is amplified by the radio frequency amplifier circuit 11 of the radio frequency amplifier 2, filtered by the radio frequency filter 12 to remove an unnecessary component out of a reception band, and converted into the first intermediate-frequency signal a by the mixer circuit 3. The first intermediate-frequency signal a passes through the variable attenuator 4, is amplified by the amplifier circuit 13 of the intermediate-frequency amplifier 5, is filtered by the intermediate-frequency filter 14 to remove an unnecessary component generated by the mixer circuit 3, and is output as the second intermediate-frequency signal b.

This second intermediate-frequency signal b is input to the limiter amplifier circuit 6, and the analog voltage c corresponding to the level of the second intermediate frequency signal b is output. This analog voltage c is converted into the digital voltage d by the analog/digital converter 7.

In consideration of the electric field strength of the radio frequency reception signal input from the antenna 1, one or more threshold values for the digital voltage d are set in the control circuit 9.

When the electric field strength of the radio frequency reception signal input from the antenna 1 is low, the first control signal e for changing the attenuation value of the variable attenuator 4 is not sent from the control circuit 9 because the digital voltage d is lower than the threshold voltage. The control circuit 9 controls the gate circuit 10 in accordance with the second control signal f so as to select an output from the first table $8_1$ for converting the digital voltage d corresponding to the attenuation value of the variable attenuator 4 into an electric field level. At this time, although the digital voltage e from the analog/digital converter 7 is input to all the N tables $8_1$ to $8_n$, even when electric field levels converted by the plurality of tables $8_1$ to $8_n$ including the table $8_1$ are output from the tables $8_1$ to $8_n$, respectively, only the electric field level output from the table $8_1$ is selected by the gate circuit 10. The gate circuit 10 outputs the electric field level from the table $8_1$ as the electric field level detection signal g on the basis of the second control signal f.

When the electric field strength of the radio frequency reception signal input from the antenna 1 becomes high, the digital voltage d exceeds the threshold value, and the first control signal e for increasing the attenuation value of the variable attenuator 4 is sent from the control circuit 9.

After the passing attenuation value of the first intermediate-frequency signal a is changed by the variable attenuator 4, the first intermediate-frequency signal a is amplified by the amplifier circuit 13, filtered by the intermediate-frequency filter 14 to remove an unnecessary component generated by the mixer circuit 3, converted into the second intermediate-frequency signal b, and input to the limiter amplifier circuit 6. The limiter amplifier circuit 6 outputs the analog voltage c corresponding to the second intermediate frequency signal b.

Figure 3:
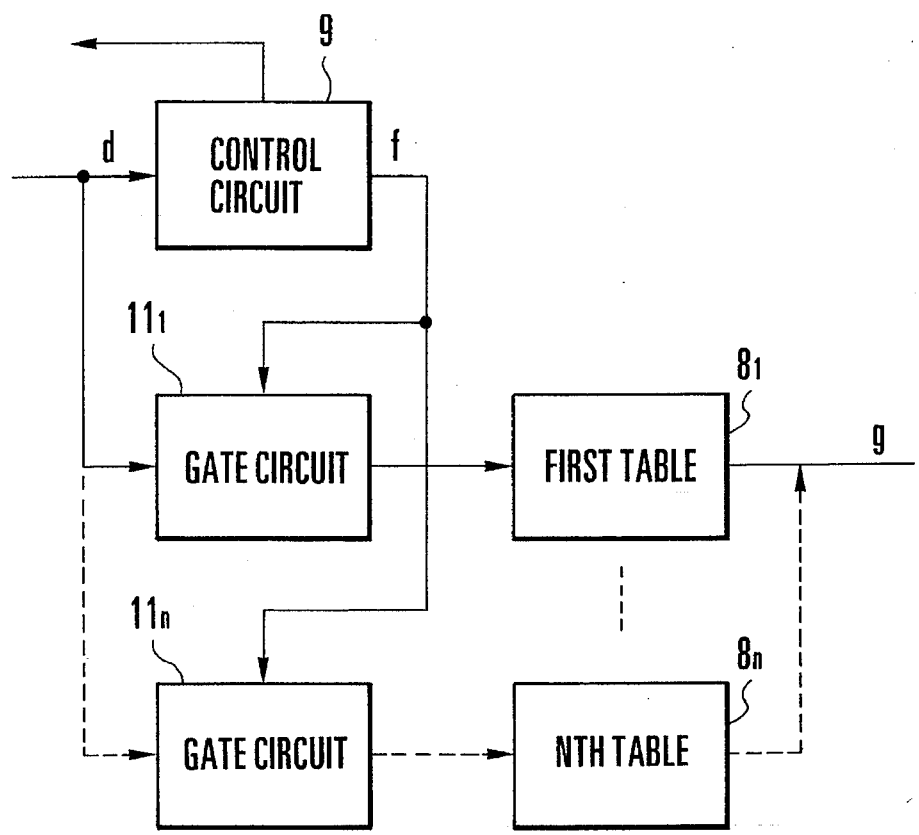
FIG. 3 is a block diagram showing another example of the portion constituted by the control circuit, the first to nth tables, and the gate circuit which are shown in FIG. 1.

At this time, since the input level of the amplifier circuit 13 decreases by the attenuation value of the variable attenuator 4, the second intermediate-frequency signal b is output through the intermediate-frequency filter 14 in correspondence with the electric field strength of the radio frequency reception signal input from the antenna 1 without saturating the amplifier circuit 13. The analog voltage c corresponding to the second intermediate-frequency signal b is output from the limiter amplifier circuit 6. This analog voltage c is converted into a digital voltage by the analog/digital converter 7, and the gate circuit 10 is controlled by the second control signal f to select an output from the nth table $8_n$ in which a converting table corresponding to the attenuation value of the variable attenuator 4 is set. The gate circuit 10 outputs an electric field level from the nth table $8_n$ as the electric field level detection signal g on the basis of the second control signal f FIG. 3 shows still another example of the portion constituted by the control circuit 9, the first to nth tables $8_1$ to $8_n$, and the gate circuit 10 which are shown in FIG. 1. As shown in FIG. 3, gate circuits $11_1$ to $11_n$ may be connected to the inputs of the first to nth tables $8_1$ to $8_n$, respectively, one of the gate circuits $11_1$ to $11_n$ may be turned on by the second control signal f from the control circuit 10, and the digital voltage d from the analog/digital converter 7 may be supplied to only one selected from the tables $8_1$ to $8_n$.

Figure 4:
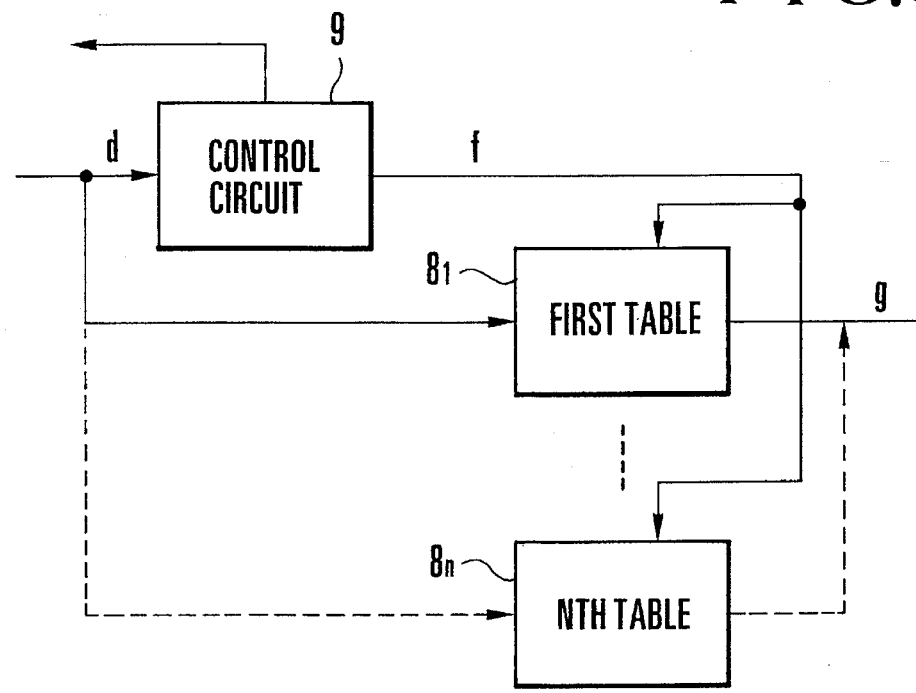
FIG. 4 is a block diagram showing still another example of the portion constituted by the control circuit, the first to nth tables, and the gate circuit which are shown in FIG. 1.
Figure 5:
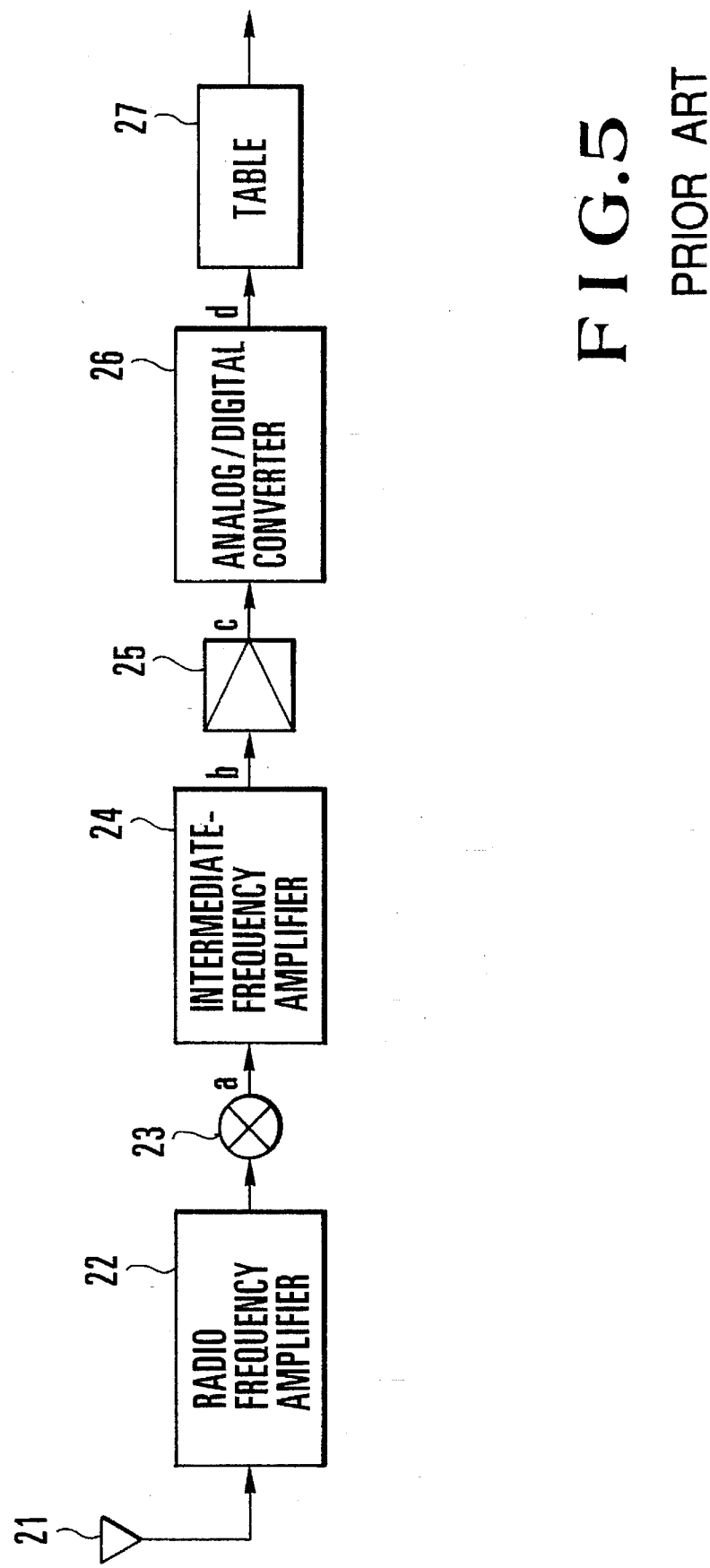
FIG. 5 is a block diagram of a conventional electric field level detecting circuit.

FIG. 4 shows another example of the portion constituted by the control circuit 9, the first to nth tables $8_1$ to $8_n$, and the gate circuit 10 which are shown in FIG. 1. In the embodiment shown in FIG. 1, the gate circuit 10 is controlled by the second control signal f from the control circuit 9 to select outputs from the tables $8_1$ to $8_n$. However, as shown in FIG. 4, a gate electrode may be omitted, and only one selected from the first to nth tables $8_1$ to $8_n$ may be directly enabled by the second control signal f.

As has been described above, according to the present invention, when the electric field strength of a radio frequency reception signal input to an antenna is high, the attenuation value of a variable attenuator is adjusted. For this reason, even when the dynamic range of an receiver is short, the receiver can advantageously detect a correct electric field.

In addition, the attenuation value of the variable attenuator is set to be changed at N steps, and N tables formed in consideration of the attenuation values are used. Therefore, an electric field detection range can be advantageously widened.

What is claimed is:

1. An electric field level detecting apparatus comprising:
   intermediate-frequency signal generating means for amplifying a radio frequency reception signal input from an antenna to convert the radio frequency reception signal into a first intermediate-frequency signal;
   variable attenuating means for receiving the first intermediate-frequency signal from said intermediate-frequency signal generating means as an input and changing a passing attenuation value in accordance with an attenuation value set to be changed at N steps (N: arbitrary natural number) by a first control signal;
   intermediate-frequency amplifying means for amplifying an output from said variable attenuating means to output a second intermediate-frequency signal;
   analog voltage generating means for outputting an analog voltage corresponding to a level of the second intermediate-frequency signal from said intermediate-frequency amplifying means;
   analog/digital converting means for converting the analog voltage from said analog voltage generating means into a digital voltage;
   N converting tables, each for storing a relationship between the digital voltage and an electric field strength of the radio frequency reception signal corresponding to the attenuation value set in said variable attenuating means in advance and converting the digital voltage from said analog/digital converting means into an electric field level signal indicating a corresponding electric field strength to output the electric field level signal; and
   control means for outputting the first control signal for setting the attenuation value of said variable attenuating means to be changed at N steps on the basis of the digital voltage from said analog/digital converting means to select one of said converting tables in accordance with the attenuation value set in said variable attenuating means.

2. An apparatus according to claim 1, further comprising output gate means for selecting one of outputs from said converting tables in accordance with a second control signal output from said control means.

3. An apparatus according to claim 1, further comprising input gate means for selecting one of said converting tables, which receives the digital voltage from said analog/digital converting means as an input, in accordance with a second control signal output from said control means.

4. An apparatus according to claim 1, wherein one of said converting tables is selectively enabled on the basis of the second control signal output from said control means.

5. An apparatus according to claim 1, wherein said analog voltage generating means is constituted by a limiter amplifier circuit.

6. An apparatus according to claim 1, wherein said intermediate-frequency signal generating means is constituted by a radio frequency amplifier for amplifying the radio frequency reception signal input from said antenna and a mixer circuit for mixing an output from said radio frequency amplifier with a local frequency signal to convert the radio frequency reception signal into the first intermediate-frequency signal, said radio frequency amplifier is constituted by a radio frequency amplifier circuit for amplifying the radio frequency reception signal input from said antenna and a radio frequency filter for receiving an output from said radio frequency amplifier circuit as an input and filtering the output to remove an unnecessary component out of a reception band, and said intermediate-frequency amplifying means is constituted by an amplifier circuit for amplifying an output from said variable attenuating means and an intermediate-frequency filter for receiving an output from said amplifier circuit as an input and filtering the output to remove an unnecessary component.

7. An electric field level detecting apparatus comprising:
   a radio frequency amplifier for amplifying a radio frequency reception signal input from an antenna;
   a mixer circuit for mixing an output from said radio frequency amplifier with a local frequency signal to convert the output into a first intermediate-frequency signal;
   a variable attenuator for receiving the first intermediate-frequency signal from said mixer circuit as an input and changing a passing attenuation value in accordance with an attenuation value set to be changed at N steps (N: arbitrary natural number) by a first control signal;
   an intermediate-frequency amplifier for amplifying an output from said variable attenuator to output a second intermediate-frequency signal;
   a limiter amplifier circuit for outputting an analog voltage corresponding to a level of the second intermediate-frequency signal from said intermediate-frequency amplifier;
   an analog/digital converter for converting the analog voltage from said limiter amplifier circuit into a digital voltage;
   N converting tables, each for storing a relationship between the digital voltage and an electric field strength of the radio frequency reception signal corresponding to the attenuation value set in said variable attenuator in advance and converting the digital voltage from said analog/digital converter into an electric field level signal indicating a corresponding electric field strength;
   control means for outputting the first control signal for setting the attenuation value of said variable attenuator to be changed at N steps on the basis of the digital voltage from said analog/digital converter and to output a second control signal in accordance with the attenuation value set in said variable attenuator; and a gate circuit for receiving outputs from said converting tables as a plurality of inputs and selecting an output from said converting tables in accordance with the second control signal from said control means.

8. An electric field level detecting apparatus comprising:

intermediate-frequency signal generator amplifying a radio frequency reception signal input from an antenna to convert the radio frequency reception signal into a first intermediate-frequency signal;

variable attenuator receiving the first intermediate-frequency signal from said intermediate-frequency signal generator as an input and changing a passing attenuation value in accordance with an attenuation value set to be changed at N steps (N: arbitrary natural number) by a first control signal;

intermediate-frequency amplifier amplifying an output from said variable attenuator to output a second intermediate-frequency signal;

analog voltage generator for outputting an analog voltage corresponding to a level of the second intermediate-frequency signal from said intermediate-frequency amplifier;

analog/digital converter converting the analog voltage from said analog voltage generator into a digital voltage;

N converting tables, each for storing a relationship between the digital voltage and an electric field strength of the radio frequency reception signal corresponding to the attenuation value set in said variable attenuator in advance and converting the digital voltage from said analog/digital converter into an electric field level signal indicating a corresponding electric field strength to output the electric field level signal; and controller outputting the first control signal for setting the attenuation value of said variable attenuator to be changed at N steps on the basis of the digital voltage from said analog/digital converter to select one of said converting tables in accordance with the attenuation value set in said variable attenuator.

9. An apparatus according to claim 8, further comprising an output gate circuit for selecting one of outputs from said converting tables in accordance with a second control signal output from said controller.

10. An apparatus according to claim 8, further comprising input gate circuit for selecting one of said converting tables, which receives the digital voltage from said analog/digital converter as an input, in accordance with a second control signal output from said controller.

11. An apparatus according to claim 8, wherein one of said converting tables is selectively enabled on the basis of a second control signal output from said controller.

12. An apparatus according to claim 8, wherein said analog voltage generator is constituted by a limiter amplifier circuit.

13. An apparatus according to claim 8, wherein said intermediate-frequency signal generator is constituted by a radio frequency amplifier for amplifying the radio frequency reception signal input from said antenna and a mixer circuit for mixing an output from said radio frequency amplifier with a local frequency signal to convert the radio frequency reception signal into the first intermediate-frequency signal, said radio frequency amplifier is constituted by a radio frequency amplifier circuit for amplifying the radio frequency reception signal input from said antenna and a radio frequency filter for receiving an output from said radio frequency amplifier circuit as an input and filtering the output to remove an unnecessary component out of a reception band, and said intermediate-frequency amplifier is constituted by an amplifier circuit for amplifying an output from said variable attenuator and an intermediate-frequency filter for receiving an output from said amplifier circuit as an input and filtering the output to remove an unnecessary component.

\* \* \* \* \*